United States Patent
Li et al.

(10) Patent No.: US 7,198,961 B2
(45) Date of Patent: Apr. 3, 2007

(54) METHOD FOR MODIFYING EXISTING MICRO-AND NANO-STRUCTURES USING A NEAR-FIELD SCANNING OPTICAL MICROSCOPE

(75) Inventors: Ming Li, Chelmsford, MA (US); Makoto Ishizuka, Osaka (JP); Chen-Hsiung Cheng, Westford, MA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 190 days.

(21) Appl. No.: 10/813,372

(22) Filed: Mar. 30, 2004

(65) Prior Publication Data

US 2005/0221577 A1  Oct. 6, 2005

(51) Int. Cl.
  *H01L 21/00* (2006.01)
(52) U.S. Cl. .......................... 438/7; 977/851
(58) Field of Classification Search .............. 438/5, 438/7, 16; 977/849–854
  See application file for complete search history.

(56) References Cited

U.S. PATENT DOCUMENTS

| | | | |
|---|---|---|---|
| 5,751,683 A | 5/1998 | Kley | |
| 5,756,997 A | 5/1998 | Kley | |
| 5,886,531 A | 3/1999 | Delcourt | |
| 6,144,028 A | 11/2000 | Kley | |
| 6,265,711 B1 | 7/2001 | Kley | |
| 6,337,479 B1 | 1/2002 | Kley | |
| 6,339,217 B1 | 1/2002 | Kley | |
| 6,720,519 B2 * | 4/2004 | Liu et al. ............... | 219/121.61 |
| 6,947,649 B2 * | 9/2005 | Li et al. ................. | 385/122 |
| 2005/0269901 A1 * | 12/2005 | Kubena et al. ........... | 310/312 |

FOREIGN PATENT DOCUMENTS

| | | |
|---|---|---|
| JP | 11-16856 | 1/1999 |
| JP | 2001-111200 A | 4/2001 |
| JP | 2001-239390 A | 9/2001 |
| WO | WO 96/03641 | 2/1996 |
| WO | WO 97/04449 | 2/1997 |
| WO | WO 98/34092 | 8/1998 |
| WO | WO 01/03157 A1 | 1/2001 |

OTHER PUBLICATIONS

International Search Report for App. No. PCT/US2005/010492.
G. Krausch et al., Surface modification in the optical near field, Microelectronic Engineering, 1996, pp. 219-228, No. 32.

(Continued)

*Primary Examiner*—Richard A. Booth
(74) *Attorney, Agent, or Firm*—RatnerPrestia

(57) ABSTRACT

A method for manufacturing a microstructure, which includes at least one fine feature on an existing feature, using an NSOM laser micromachining system. A microstructure device preform is provided. A portion of its top surface is profiled with the NSOM to produce a topographical image. This profiled portion is selected to include the existing feature. An image coordinate system is defined for the profiled portion of top surface based on the topographical image. Coordinates of a reference point and the orientation of the existing feature in the image coordinate system are determined using the topographical image. The probe tip of the NSOM is aligned over a portion of the existing feature using the determined coordinates of the reference point and the orientation of the existing feature. The top surface of the microstructure device preform is machined with the micromachining laser to form the fine feature(s) on the existing feature.

25 Claims, 9 Drawing Sheets

OTHER PUBLICATIONS

Anargyros L. Panayotopoulos, Near-field laser assisted localized crystal growth and nanodeposition, Proc. Of SPIE, 2004, pp. 676-684, vol. 5339.

A. Chimmalgi et al., Femtosecond laser aperturless near-field nanomaching of metals assisted by scanning probe microscopy, Applied Physics Letters, Feb. 24, 2003, pp. 1146-1148, vol. 82, No. 8.

K. Lieberman et al., Near-field optical photomask repair with a femtosecond laser, Journal of Microscopy, May/Jun. 1999, pp. 537-541, vol. 194, Pt 2/3.

* cited by examiner

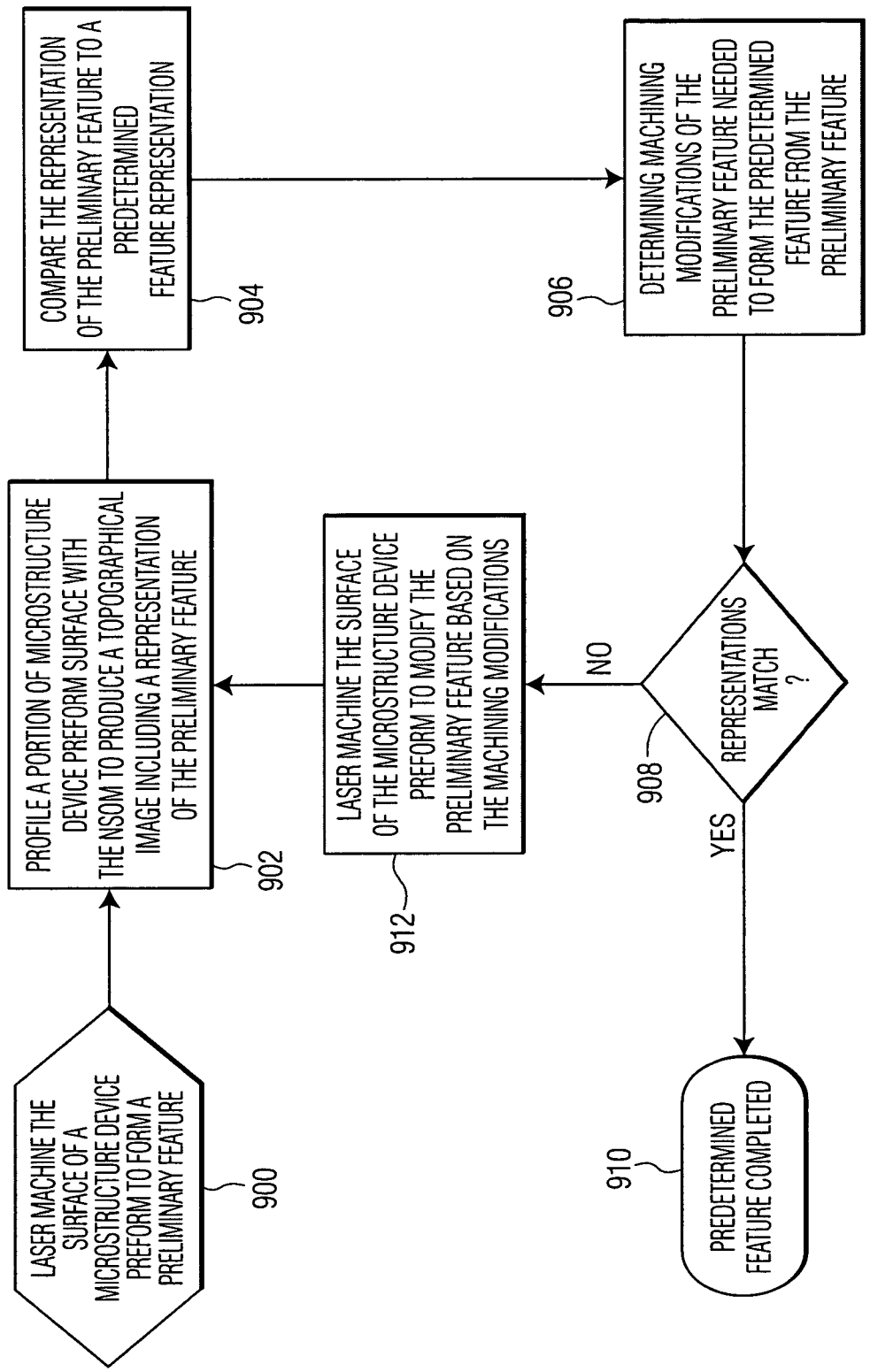

METHOD FOR MODIFYING EXISTING MICRO-AND NANO-STRUCTURES USING A NEAR-FIELD SCANNING OPTICAL MICROSCOPE

FIELD OF THE INVENTION

The present invention concerns an apparatus and method for laser machining of existing features on existing microstructures, including nanostructures, using a near-field scanning optical microscope (NSOM). This method may also allow mass customization or repair of generic electronic and mechanical microstructures.

BACKGROUND OF THE INVENTION

As products get smaller and smaller, there is increased demand for micro-electrical-mechanical systems (MEMS), micro-optical devices and photonic crystals. With this demand, there is an associated increased interest in micro- and nano-machining. Numerous applications exist for MEMS. As a breakthrough technology, allowing unparalleled synergy between previously unrelated fields such as biology and microelectronics, new MEMS applications are emerging at a rapid pace, expanding beyond those currently identified or known. Additional applications in quantum electric devices, micro-optical devices and photonic crystals are also emerging.

Here are a few applications of current interest:

Quantum Electrical Devices

Interest in ideas such as quantum computing have led to the development of devices requiring increasing smaller dimensions, such as cellular automata and coupled quantum dot technologies. Resonant tunneling devices such as resonant tunneling diodes, which may utilize quantum effects of transmission electrons to increase the efficiency of microwave circuits, require particularly fine features.

Micro-Optics

The application of micro-machining techniques to optics has lead to numerous advances in optical fabrication such as gray scale technology. Gray scale technology allows for the creation of a wide variety of shapes allowing for the best optical performance achievable. Traditional binary optics rely on a "stair step" shaped approximation of the ideal surface shape. Gray scale can actually create that ideal shape. Curves, ramps, torroids, or any other shape is possible. Multi-function optics, microlens arrays, diffusers, beam splitters, and laser diode correctors may all benefit from the use of gray scale technology. These optical devices as well as others, including fine pitch gratings for shorter and shorter wavelength light, benefit from increased precision available using micro-machining. Optical MEMS devices including beam shapers, continuous membrane deformable mirrors, moving mirrors for tunable lasers, and scanning two axis tilt mirrors have also emerged due to progress in micro-machining technology.

Photonic Crystals

Photonic crystals represent an artificial form of optical material that may be used to create optical devices with unique properties. Photonic crystals have many optical properties that are analogous to the electrical properties of semiconductor crystals and, thus, may also allow the development of optical circuitry similar to present electrical semiconductor circuitry. The feature sizes used to form photonic crystals and the precise alignment requirements of these features complicate manufacture of these materials. Improved alignment techniques and reduced minimum feature size capabilities for micro-machining systems may lead to further developments in this area.

Biotechnology

MEMS technology has enabling new discoveries in science and engineering such as: polymerase chain reaction (PCR) microsystems for DNA amplification and identification; micro-machined scanning tunneling microscope (STM) probe tips; biochips for detection of hazardous chemical and biological agents; and microsystems for high-throughput drug screening and selection.

Communications

In addition to advances that may result from the use of resonant tunneling devices, high frequency circuits may benefit considerably from the advent of RF-MEMS technology. Electrical components such as inductors and tunable capacitors made using MEMS technology may perform significantly better than their present integrated circuit counterparts. With the integration of such components, the performance of communication circuits may be improved, while the total circuit area, power consumption and cost may be reduced. In addition, a MEMS mechanical switch, as developed by several research groups, may be a key component with huge potential in various microwave circuits. The demonstrated samples of MEMS mechanical switches have quality factors much higher than anything previously available. Reliability, precise tuning, and packaging of RF-MEMS components are to be critical issues that need to be solved before they receive wider acceptance by the market.

Advances in micro-optics and the introduction of new optical devices using photonic crystals may also benefit communications technology.

Accelerometers

MEMS accelerometers are quickly replacing conventional accelerometers for crash air-bag deployment systems in automobiles. The conventional approach uses several bulky accelerometers made of discrete components mounted in the front of the car with separate electronics near the air-bag. MEMS technology has made it possible to integrate the accelerometer and electronics onto a single silicon chip at a cost of $1/5$ to $1/10$ of the cost of the conventional approach. These MEMS accelerometers are much smaller, more functional, lighter, and more reliable as well, compared to the conventional macro-scale accelerometer elements.

Micro-Circuitry

Reducing the size of electronic circuits is another area in which MEMS technology may affect many fields. As the density of components and connections increases in these microcircuits, the processing tolerances decrease. One challenge in producing micro-circuitry is preventing shorts between components and nano-wires which are located ever closer together. Yields may be significantly increased by micromachining methods with the capability to repair these defects.

This illustrates one particular challenge in micro-machining, how to modify existing micro- or nano-structures (i.e. where the work piece already has complicated microstructures). Micromachining of submicron features has been a domain predominated by electron-beam, ultraviolet beam, and X-ray lithographic machines, as well as focused ion beam machines. These high-cost techniques usually require stringent environmental conditions, such as high vacuum or clean room condition. All the lithographic methods require a series of complicated procedures, which involve generating multiple masks and using photoresist. If a beam processing technique is used, this process requires the beam to be directed accurately at the desired location with a high degree of precision for proper processing. Only four currently available technologies (laser direct writing, focused ion beam writing, micro electric discharge machine, and photochemical etching) have this potential capability. Other techniques (for example ion beam milling) are only desirable for flat wafer processing. However, direct laser writing has additional advantages, including operation in ambient air and low materials dependence.

The emergence of ultrafast lasers makes submicron-level direct writing possible. In late 1999 and early 2000, the capability of femtosecond laser with a UV wavelength of 387 nm to machine ~200 nm air holes with pitch size of ~420 nm in plain Si-on-SiO$_2$ substrate was demonstrated. This demonstration met both the feature size (<200 nm) and pitch size (<420 nm) requirements for a 1D waveguide photonic crystal. The next step was to study drilling small holes on narrow waveguides to make a 1D photonic crystal. Ultrafast lasers have proven to be very versatile tools for micro-, nano-machining. Feature sizes as small as ~250 nm have now been demonstrated using ultrafast laser beam machining. Still alignment of a laser beam to nanostructures on existing microstructures is a difficult issue.

Micromachining of submicron features has been a domain predominated by electron-beam, ultraviolet beam, and X-ray lithographic machines, as well as focused ion beam machines. These high-cost techniques usually require stringent environmental conditions, such as high vacuum or clean room condition. All the lithographic methods require a series of complicated procedures, which involve generating multiple masks and using photoresist.

Laser machining of surfaces using the near-field radiation of a near-field scanning optical microscope (NSOM), sometimes also known as scanning near-field optical microscope, has been proposed as a means of laser machining submicron features. One potential method for micromachining surfaces in this way is disclosed in Japanese Patent Application 2000-51975, LASER MACHINING APPARATUS AND ITS METHOD AND AN OPTICAL ELEMENT MACHINED BY USING SAME, to H. Owari, et al. Owari, et al. disclose using light from a short-wavelength ultraviolet laser that is transmitted through the probe of an atomic force microscope to laser machine an optical grating.

SUMMARY OF THE INVENTION

An exemplary embodiment of the present invention is a method for manufacturing a microstructure, which includes at least one fine feature on an existing feature, using an NSOM laser micromachining system that includes an NSOM and a micro-machining laser. A microstructure device preform including the existing feature on a top surface is provided. A portion of the top surface of the microstructure device preform is profiled with the NSOM to produce a topographical image of the portion of the top surface. The profiled portion of the top surface is selected such that the topographical image includes a representation of the existing feature. An image coordinate system, in terms of settings of the NSOM, is defined for the profiled portion of top surface of the microstructure device preform based on the topographical image. Coordinates of a reference point and the orientation of the existing feature of the top surface of the microstructure device preform in the image coordinate system are determined using the topographical image. The probe tip of the NSOM probe of the NSOM is aligned over a portion of the existing feature of the microstructure device preform using the determined coordinates of the reference point and the orientation of the existing feature. The top surface of the microstructure device preform is machined with the micro-machining laser to form the at least one fine feature on the existing feature, completing the microstructure device.

Another exemplary embodiment of the present invention is a method for mass customizing microstructures with an NSOM laser micromachining system that includes an NSOM and a micro-machining laser. Each microstructure is customized to have at least one of a predetermined set of customization features. A number of microstructure preforms that include a top surface and an existing feature on the top surface are provided. One microstructure preform is selected from the provided microstructure preforms and at least one customization feature from the set of customization features is selected. The selected customization feature(s) are to be located on the existing feature. The selected microstructure preform is mounted in the NSOM. A portion of the top surface of the microstructure preform is profiled with the NSOM to produce a topographical image of the portion of the top surface. The profiled portion of the top surface is selected such that the topographical image includes a representation of the existing feature. An image coordinate system, in terms of settings of the NSOM, is defined for the profiled portion of top surface of the microstructure preform based on the topographical image. Coordinates of a reference point and the orientation of the existing feature of the top surface of the microstructure preform in the image coordinate system are determined using the topographical image. The probe tip of the NSOM probe of the NSOM is aligned over a portion of the existing feature of the microstructure preform using the determined coordinates of the reference point and the orientation of the existing feature. The top surface of the microstructure preform is machined with the micro-machining laser to form the selected customization feature(s), forming a customized microstructure. Other microstructure preforms are selected one at a time and the customization steps are repeated for each of the provided microstructure preforms.

An additional exemplary embodiment of the present invention is a method for repairing a microstructure, which includes a defect on a top surface, with an NSOM laser micromachining system that includes an NSOM and a micro-machining laser. The defective microstructure is mounted in the NSOM. A portion of the top surface of the defective microstructure is profiled with the NSOM to produce a topographical image of the portion of the top surface. The profiled portion of the top surface is selected such that the topographical image includes a representation of the defect. An image coordinate system, in terms of settings of the NSOM, is defined for the profiled portion of top surface of the defective microstructure based on the topographical image. Coordinates of the defect of the top surface of the defective microstructure in the image coordinate system are determined using the topographical image. The probe tip of the NSOM probe of the NSOM is aligned over a portion of the defect of the defective microstructure using the determined coordinates of the defect. The top surface of the defective microstructure is machined with the micro-machining laser to repair the defect of the defective microstructure.

A further exemplary embodiment of the present invention is a method for laser machining a predetermined feature on a surface of a microstructure device preform, using an NSOM laser micromachining system. The NSOM laser micromachining system includes an NSOM and a micromachining laser. The surface of the microstructure device preform is laser machined to form a preliminary feature. A portion of the surface of the microstructure device preform is profiled with the NSOM to produce a topographical image of the portion of the surface. The portion of the surface is selected such that the topographical image includes a representation of the preliminary feature. This representation of the preliminary feature in the topographical image is compared to a predetermined feature representation and machining modifications to the preliminary feature that are needed to form the predetermined feature from the preliminary feature are determined based on this comparison. The surface of the microstructure device preform is laser machined again to modify the preliminary feature based on the determined machining modifications. The profiling, comparing and modifying of the preliminary feature is repeated until its representation substantially matches the predetermined feature representation.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures:

FIG. 9 is a flow chart illustrating an exemplary method of laser machining a predetermined feature on a microstructure device preform according to the present invention.

DETAILED DESCRIPTION OF THE INVENTION

NSOMs use many of the same principles as atomic force microscopes (AFMs) to accurately profile surfaces. Laser micromachining of these surfaces using near-field radiation from an NSOM probe tip may provide a number of advantages compared to using non-near-field radiation and free space optics. The advantages may include precise positioning control of the NSOM probe tip and a reduced minimum feature size. The precise motion stages used in NSOM devices may be used to provide precise horizontal (X and Y) and vertical (Z) positioning control. Additionally, the ability of an NSOM to profile a surface allows for the accurate vertical positioning of the probe tip desired to couple significant near-field radiation to the surface.

The minimal feature size that may be machined with an exemplary NSOM laser machining system of the present invention using near-field radiation is determined by the size of the NSOM probe tip, rather than by the wavelength of the laser light used to generate the near-field radiation. This may allow a laser machining apparatus to machine areas on a surface, which are smaller than the diffraction limited spot size of a free space laser beam from the same laser source. The wavelength of the laser is still an issue, though, because it affects the efficiency with which the light may be coupled into the near-field through the NSOM probe tip. Thus, the use of short wavelength UV lasers with wavelengths may still be desirable, but not as critical as in laser micromachining systems using non-near-field radiation, and free space optics to focus the laser light.

Figure 1:
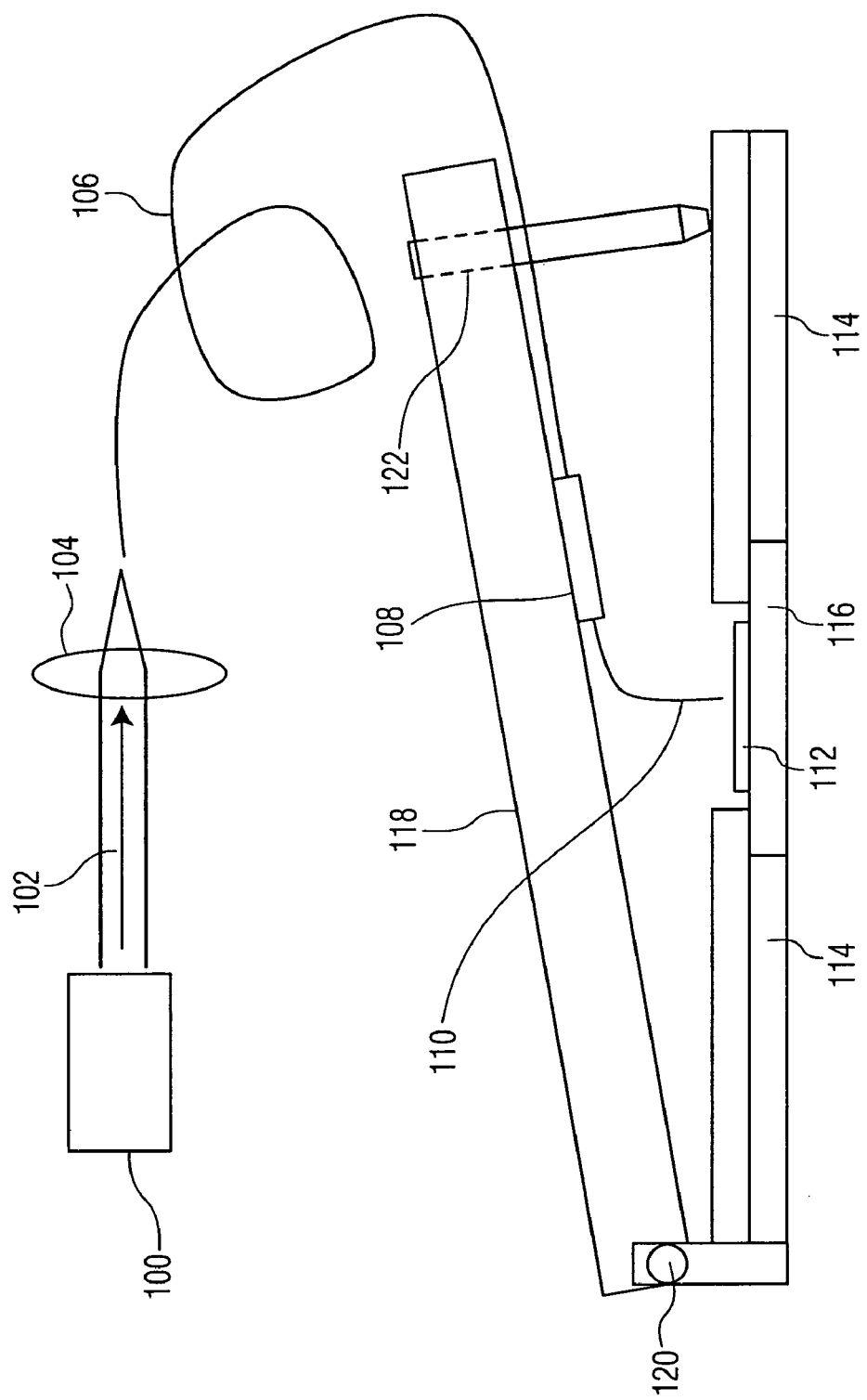
FIG. 1 is a block diagram of an exemplary NSOM laser micro-machining system that may be used to perform any of the exemplary methods of the present invention.

FIG. 1 illustrates a simplified block diagram of an exemplary NSOM laser micromachining system that may be used with the exemplary methods of the present invention. Quantum cellular automata, coupled quantum dot devices, resonant tunneling devices, multifunction optical arrays, diffractive optical elements, beam shapers, microlens arrays, optical diffusers, beam splitters, laser diode correctors, fine pitch gratings, photonic crystals, micro-electrical-mechanical systems, micro-circuitry, micro-surface-acoustic-wave devices, micro-mechanical oscillators, polymerase chain reaction Microsystems, biochips for detection of hazardous chemical and biological agents, high-throughput drug screening and selection microsystems, and molds to form other microstructures are examples of microstructures that may be machined by an exemplary NSOM laser micromachining system of the present invention.

As described below with reference to the exemplary methods of FIGS. 5, 7, and 8, these microstructures may be manufactured, mass customized, or repaired using such an exemplary system. This exemplary system includes laser source 100, optical fiber 106, NSOM probe holder 108, and NSOM probe 110 to generate and transmit pulses of laser light to workpiece 112, as well as lens 104 to couple optical beam 102 into optical fiber 106 and numerous NSOM components to position NSOM probe 110.

It is noted that an ultrafast laser source may desirably be used in the exemplary system of FIG. 1, but that longer pulsed, high energy lasers may be used as well. Ultrafast laser sources may provide significantly higher peak power levels than longer pulsed laser source (i.e. lasers with pulse durations>1 ns) and CW laser sources. These high peak powers may be desirable to help increase the fluence of laser light that is coupled through the probe tip into the near-field. Providing higher peak powers in NSOM probe 110 may allow the use of even smaller NSOM probe tips compared to the wavelength of ultrafast laser source 100, as may increasing the pulse energy of longer pulses.

In the exemplary system of FIG. 1, laser source 100 may desirably include any type of solid state gain medium typically used for laser machining applications, such as: Cr:YAG (peak fundamental wavelength, $\lambda_f$=1520 nm); Cr:Forsterite ($\lambda_f$=1230–1270 nm); Nd:YAG and Nd:YVO4 ($\lambda_f$=1064 nm); Nd:GdVO4 ($\lambda_f$=1063 nm); Nd:YLF ($\lambda_f$=1047 nm and 1053 nm); Nd:glass ($\lambda_f$=1047–1087 nm); Yb:YAG ($\lambda_f$=1030 nm); Cr:LiSAF ($\lambda_f$=826–876 nm); Ti:Sapphire ($\lambda_f$=760–820 nm); and Pr:YLF ($\lambda_f$=612 nm). These solid state gain media may be pumped using standard optical pumping systems such as flash lamp, erbium doped fiber lasers, and diode lasers, the output pulses of which may be directly coupled into the solid state gain medium or may undergo harmonic generation before being used to pump the solid state gain medium. The solid state gain medium (media) may be configured to operate as one or more of: a laser oscillator; a single pass amplifier; and/or a multiple pass amplifier. This element also includes optics to substantially collimate the laser light. Laser source 100 may desirably produce nearly Fourier-transform limited pulses. If an ultrafast laser source is desired these pulses may have a duration of less than about 1 ns, typically less than 20 ps. An additional, non-solid state, single or multiple pass amplifier such as a XeCl, KrF, ArF, or $F_2$ excimer amplifier (not shown) may be included to increase the output power of laser source 100. Alternatively, laser source 100 may include an excimer laser system (e.g. XeCl, $\lambda_f$=308 nm; KrF, $\lambda_f$=248 nm; ArF, $\lambda_f$=193 nm; or $F_2$, $\lambda_f$=157 nm), a dye laser system (e.g. 7-diethylamino-4-methylcoumarin, $\lambda_f$=435–500 nm; benzoic acid, 2-[6-(ethylamino)-3-(ethylimino)-2,7-dimethyl-3H-xanthen-9-yl]-ethyl ester, monohydrochloride, $\lambda_f$=555–625 nm; 4-dicyanmethylene-2-methyl-6-(p-dimethylaminostyryl)-4H -pyran, $\lambda_f$=598–710 nm; or 2-(6-(4-dimethylaminophenyl)-2,4-neopentylene-1,3,5-hexatrienyl)-3-methylbenzothiazolium perchlorate, $\lambda_f$=785–900 nm), or other laser system used in laser machining applications (e.g. $CO_2$, $\lambda_f$=10.6 μm).

It may be desirable for laser source 100 to have a peak wavelength of less than approximately 400 nm to improve near-field coupling through submicron probe tips. A harmonic generation crystal may be used within this component to reduce the peak wavelength of the pulses of laser light. Desirably, a frequency-doubled, 150 fs Ti:Sapphire laser (for example a Clark MXR CPA2000) may be used as laser source 100.

Additionally, laser source 100 may include optics to control the intensity, polarization, and/or collimation of its laser beam output. A polarization controller may be included to control the polarization of the pulses of laser light generated by laser source 100. These pulses may be desirably circularly polarized. A shutter and/or a variable attenuator may be included in laser source 100 as well. These components may be coupled to control circuitry of the NSOM (not shown) to control laser machining of features on the surface of microstructure preform 112.

The output of laser source 100 may be focused by lens 104 into optical fiber 106, which desirably has a fiber core formed of a waveguide material that has low absorptivity near the peak wavelength of the pulses of laser light. Optical fiber 106 may be a part of NSOM probe 110 and the cleaved end of optical fiber 106 may function as the input plane of NSOM probe 110. This may be desirable to reduce coupling losses in the system. NSOM probe 110, including its optical fiber portion 106, is held in NSOM probe holder 108.

Alternatively, optical fiber 106 may be separate from NSOM probe 110. In this alternative embodiment, NSOM probe 110 may only extend from the probe tip into NSOM probe holder 108. Optical fiber 106 transmits the pulses of laser light to the NSOM probe 110 through an input plane at the end of NSOM probe 110. Both optical fiber 106 and NSOM probe 110 are held in NSOM probe holder 108. Optical fiber 106 and NSOM probe 110 are aligned to allow for low loss coupling of the pulses of laser light into the NSOM probe. The input plane of NSOM probe 110 is desirably a cleaved fiber end and has an input area approximately equal to a cross-sectional area of the cleaved end of optical fiber 106. NSOM probe holder 108 may include optics, such as a ball lens to assist in optically coupling optical fiber 106 and NSOM probe 110. It is noted that pulses of optical beam 102 may alternatively be coupled directly into NSOM probe 110 without the use of optical fiber 106 to reduce dispersion effects, but this may complicate alignment of the system.

NSOM probe 110 is formed in a substantially cylindrical shape. It is noted that, although a cross-sectional shape of this substantially cylindrical shape may desirably be similar to optical fiber 106 near the end of NSOM probe 110 that acts as the input plane, this is not necessary. The cross-sectional shape of NSOM probe 110 may desirably be circular or another elliptical shape, or alternatively may be another shape used for waveguides, such as rectangular, and may change in size or shape along its length. For example, the substantially cylindrical shape of NSOM probe 110 tapers near its tip end to produce the probe tip. Additionally, it is contemplated that the substantially cylindrical shape of NSOM probe 110 may include a bend along its axis, as shown in FIG. 1.

Figure 2:
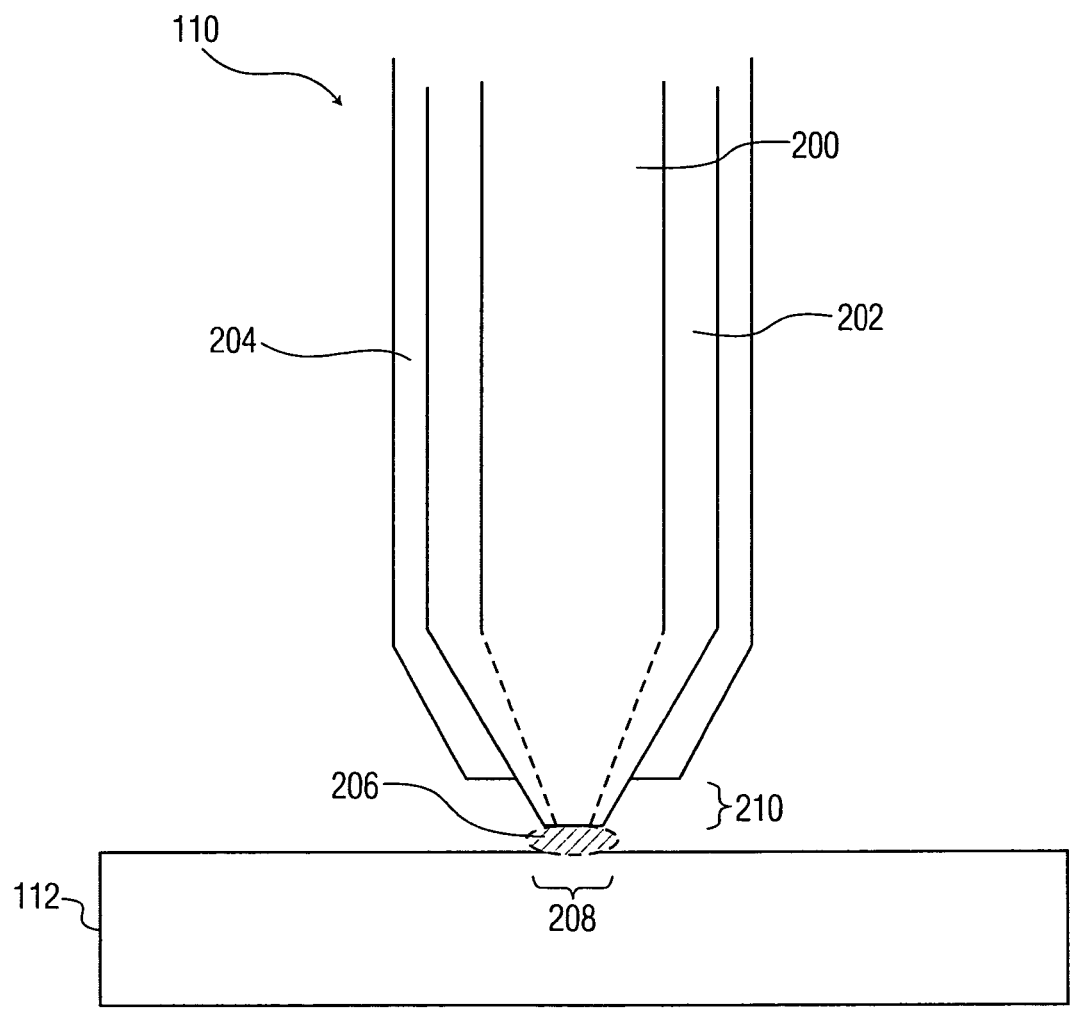
FIG. 2 is a side cut-away drawing of an exemplary NSOM probe that may be included in the exemplary system of FIG. 1 cut along a diameter of the exemplary NSOM probe.

FIG. 2 illustrates a close view of the tip end of exemplary NSOM probe 110. The end of the NSOM probe including the input plane is not shown in FIG. 2. Probe tip 210, which is located at the other end of NSOM probe 110 from the input plane, is shown. NSOM probe 110 includes a portion of optically transmissive core 200 and may also include a portion of cladding layer 202, as shown. In probe tip 210 the materials of optically transmissive core 200 and cladding layer 202 may be indistinguishable, illustrated by the dashed lines separating these materials in the tip region of the exemplary tip in FIG. 2. NSOM probe tip 210, from which near-field 206 emanates, may desirably have cross-sectional area of less than a square of the peak wavelength of the pulses of laser light and an elliptical cross-sectional shape, which allows machining of similar elliptical shapes with axes shorter than the peak wavelength in near-field irradiated area 208 of microstructure preform 112.

Optically transmissive core 200 desirably extends from the input plane to probe tip 210 and is optically coupled to laser source 100 through optical fiber 106 at the input plane. As with the fiber core of optical fiber 106, optically transmissive core 200 of NSOM probe 110 is formed of a material that has low absorptivity near the peak wavelength of the pulses of laser light and may desirably be formed of the same waveguide material. Cladding layer 202 desirably extends from the input plane to probe tip 210 to help confine the pulses of laser light within transmissive core 200, but may be omitted if sufficient confinement may occur without it.

Figure 3:
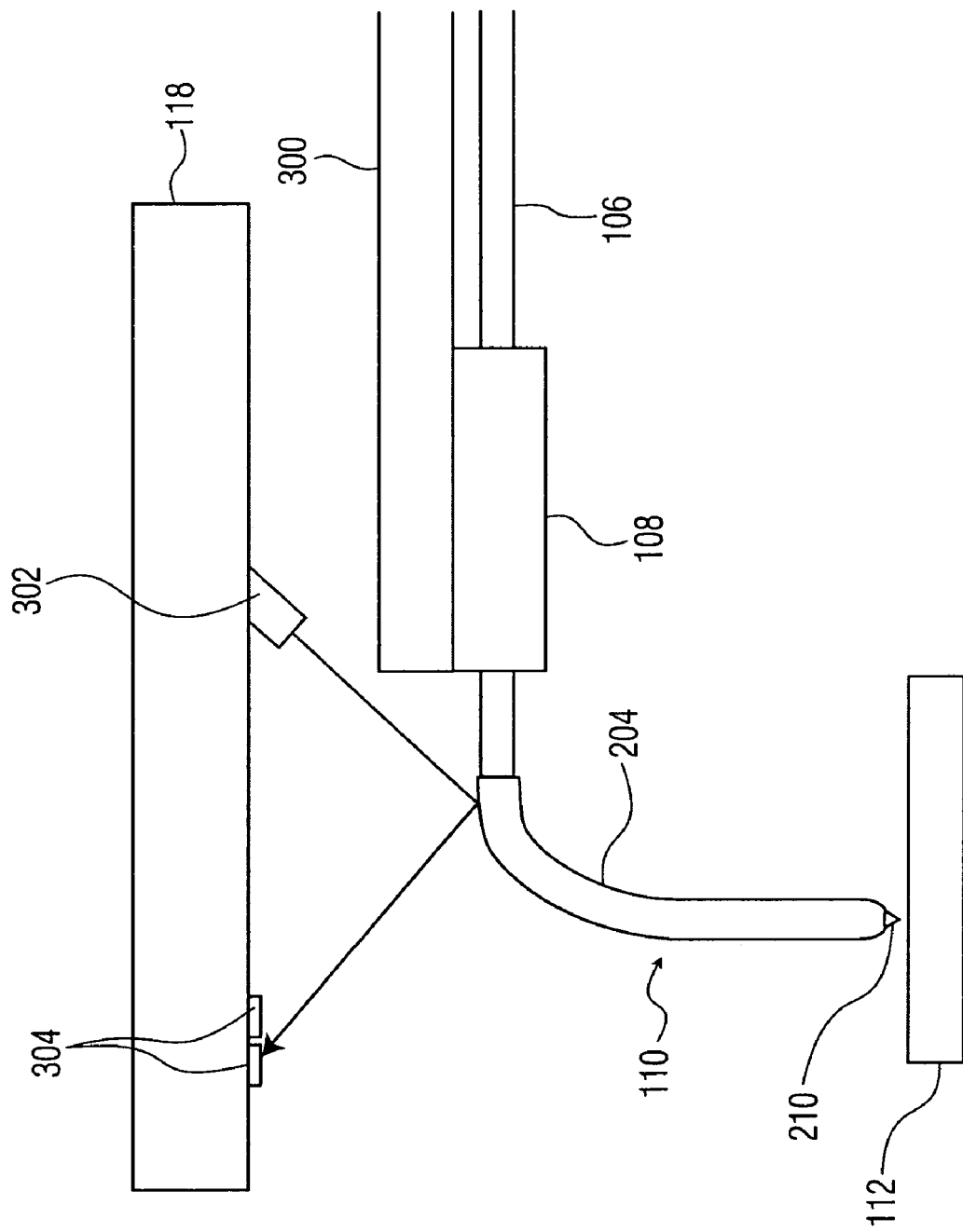
FIG. 3 is a side plan drawing of an exemplary NSOM probe, probe holder, and probe position monitor configuration that may be included in the exemplary system of FIG. 1.

Radiation confinement coating 204 is also formed on NSOM probe 110 and extends from adjacent to probe tip 210 along the side surface of the probe. Radiation confinement coating 204 provides additional confinement of the pulses of laser light in optically transmissive core 200 in sections of NSOM probe 110 that may otherwise be particularly leaky, such as the narrow section near probe tip 210 and any sections with a tight radius of curvature. Additionally, radiation confinement coating 204 substantially defines the area of probe tip 210, by its absence. It may extend as far as or to an opening adjacent to the input plane or may only extend a portion of that distance. In an exemplary embodiment in which the NSOM probe has a 90° bend it is desirable for radiation confinement coating 204 to extend at least around the bend, as shown in FIG. 3. Radiation confinement coating 204 has high reflectivity near the peak wavelength of the pulses of laser light and desirably has low absorptivity in this band as well. It may include at least one metal and/or dielectric layer. It is further noted, as shown in FIG. 3, that it may be desire for radiation confinement coating 204 to be substantially reflective to light that may be used for optically monitoring the position of NSOM probe 110.

Returning to FIG. 1, NSOM probe holder 108 is coupled to an NSOM mount to controllably hold and position NSOM probe 110. The NSOM mount also controllably holds and positions microstructure preform 112 relative to NSOM probe 110. The NSOM mount includes top support 118 which is connected to NSOM base 114 by hinge 120. This configuration allows NSOM probe 110 to be easily lifted away from microstructure preform 112 to allow inspection and/or replacement of the probe or mounting and dismounting of workpieces. Gross vertical, or Z, positioning of NSOM probe 110 over microstructure preform 112 may be accomplished using set screw 122 which may be coupled to a lead screw (not shown) or a stepper motor (not shown). The exemplary NSOM mount of FIG. 1 also includes workpiece positioning section 116 on which microstructure preform 112 is mounted. Workpiece positioning means 116 is coupled to NSOM base 114. It is noted that, although the exemplary embodiment of FIG. 1 includes workpiece positioning means 116 for positioning microstructure preform 112 relative to NSOM probe 110, one skilled in the art may understand that a positioning means to position NSOM probe 110 relative to microstructure preform 112 may be used in addition to, or in place of, workpiece positioning means 116.

Workpiece positioning means 116 may include, for example, a computer-controlled XYZ motion stage with micrometer resolution (for example, a micron resolution XYZ motion stage manufactured by Burleigh). A computer-controlled, piezo-electric XY motion stage with nanometer-resolution (for example, a piezo-electric XY motion stage manufactured by Queensgate) may also be included. Fine Z positioning may be accomplished using a piezo-electric Z motion stage in workpiece positioning means 116. These computer-controlled motion stages of workpiece positioning means 116 may be used to position the NSOM of the laser micro-machining system over the surface of microstructure preform 112, with the micrometer resolution XYZ motion stage providing coarse positioning and the piezo-electric motion stages providing fine positioning. Alternatively, other fine motion stages capable of nanometer resolution may be used to provide fine positioning.

Figure 4:
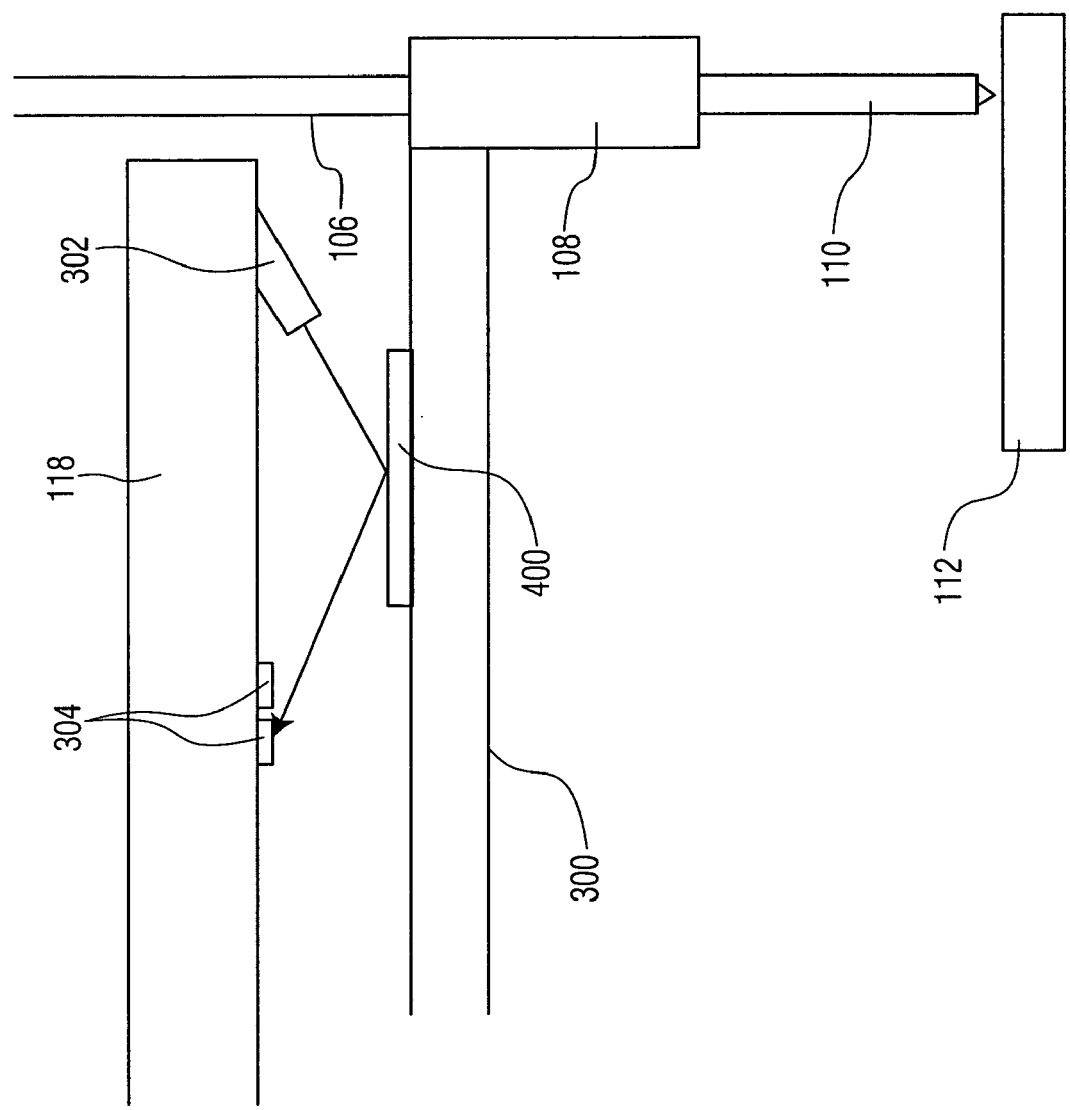
FIG. 4 is a side plan drawing of an alternative exemplary NSOM probe, probe holder, and probe position monitor configuration that may be included in the exemplary system of FIG. 1.

The exemplary NSOM laser micromachining system of FIG. 1 also includes an NSOM control system. Two exemplary NSOM control systems are illustrated in FIGS. 3 and 4. These exemplary NSOM control systems include NSOM probe monitors and NSOM controllers, which are coupled to the NSOM probe monitor, the piezo-electric XY motion stage, and the piezo-electric Z motion stage. The NSOM probe monitor determines the distance between probe tip 210 of the NSOM probe 110 and the surface of the microstructure preform 112.

The NSOM controller (not shown) uses this distance information to control the vertical position of either NSOM probe 110 or microstructure preform 112 (or both) by sending a signal to the Z motion stage(s), depending on which is coupled to the positioning means. The NSOM controller also controls the horizontal position of either NSOM probe 110 or microstructure preform 112 by sending a signal to the XY motion stage(s) based on the feature to be laser machined on the surface of microstructure preform 112. The NSOM controller may include circuitry or an ASIC, and may include a general purpose computer programmed to drive the motion stages in response to distance information from the NSOM probe monitor and input data regarding the feature to be machined on the surface of the microstructure workpiece.

FIGS. 3 and 4 illustrate two exemplary NSOM probe monitors based on optical means of making atomic force measurements. The exemplary embodiment of FIG. 3 includes an NSOM probe with a 90° bend and the exemplary embodiment of FIG. 4 includes a straight NSOM probe. These alternative embodiments of NSOM probe 110 are merely illustrative and not limiting.

Each of the exemplary NSOM probe monitors in FIGS. 3 and 4 uses cantilevered arm 300 to couple NSOM probe holder 108 to NSOM top support 118. NSOM top support 118 is substantially rigid, while cantilevered arm 300 may move a calibrated amount relative to NSOM top support 118 in a direction substantially normal to the surface of microstructure preform 112. This calibrated movement may result from flexing of cantilevered arm 300 or may be due to pivoting of cantilevered arm 300 on the coupling (not shown) between cantilevered arm 300 and NSOM top support 118 in response to atomic force between probe tip 210 and the surface of microstructure preform 112. Alternatively, NSOM probe 110 may be periodically oscillated by an NSOM probe oscillator coupled to cantilevered arm 300. The amplitude of this periodic oscillation of NSOM probe 110 is desirably small, in the range of 0 to 20 nm. Changes in one, or both, of the period or amplitude of this periodic oscillation of NSOM probe 110 may provide the calibrated movement for the probe monitor.

The exemplary NSOM probe monitor of FIG. 3 involves an optical sensing method in which light is reflected directly off of radiation confinement coating 204. Light source 302 is coupled to substantially rigid top support 118 as is an optical detector that includes at least two optical regions 304. Light source 302 produces a substantially collimated beam of light. This substantially collimated beam of light is reflected off of radiation confinement coating 204 and is then detected by the optical detector. As NSOM probe 110 moves up and down in response to atomic force between probe tip 310 and the surface of microstructure preform 112, cantilevered arm 300 either flexes or pivots, changing the angle of incidence between the substantially collimated beam of light from light source 302 and radiation confinement coating 204. This changes the location at which the substantially collimated beam of light is incident of the optical detector. Cantilever flexing may also change the point of incidence which may further change the location at which the substantially collimated beam of light is incident of the optical detector. Additionally, possible flexing of NSOM probe 110 due to atomic force may be detected as well. The multiple detector regions 304 allow the optical detector to generate a signal based on an amount of light detected by each detector region. Processing means in the NSOM controller receive this detector signal and may determine the distance between the probe tip of the NSOM probe and the surface of the microstructure workpiece based on the amount of light detected by each detector region 304 of the optical detector. This distance determination by the processing means may involve determining and indicating that the distance between the probe tip of the NSOM probe and the surface of the microstructure workpiece is greater than or less than a desired distance, or may alternatively provide a calibrated distance reading.

The exemplary NSOM probe monitor of FIG. 4 uses an alternative optical sensing method in which light is reflected off of reflective planar surface 400 that is coupled to cantilevered arm 300. The substantially collimated beam of light from light source 302 is reflected off of reflective planar surface 400 and is then detected by the optical detector, changing the location at which the substantially collimated beam of light is incident of the optical detector. The atomic force on NSOM probe 110, and, thus, the distance between the probe tip of the NSOM probe and the surface of the microstructure workpiece may then be determined from the detector signal of the optical signal, as in the exemplary embodiment of FIG. 3.

Alternatively, the exemplary NSOM probe monitor may be based another means of detecting the atomic force on the NSOM probe. Any means that is used in atomic force microscopes may be used in the present invention. For example, a tuning fork method may be used in which the resonance frequencies of a matched pair of tuning forks are compared. One tuning fork is coupled to the NSOM probe so that forces on the probe may affect the resonance frequency of the tuning fork. Differences in the resonance frequencies of the tuning forks may then be correlated to atomic force on the NSOM probe.

Figure 5:
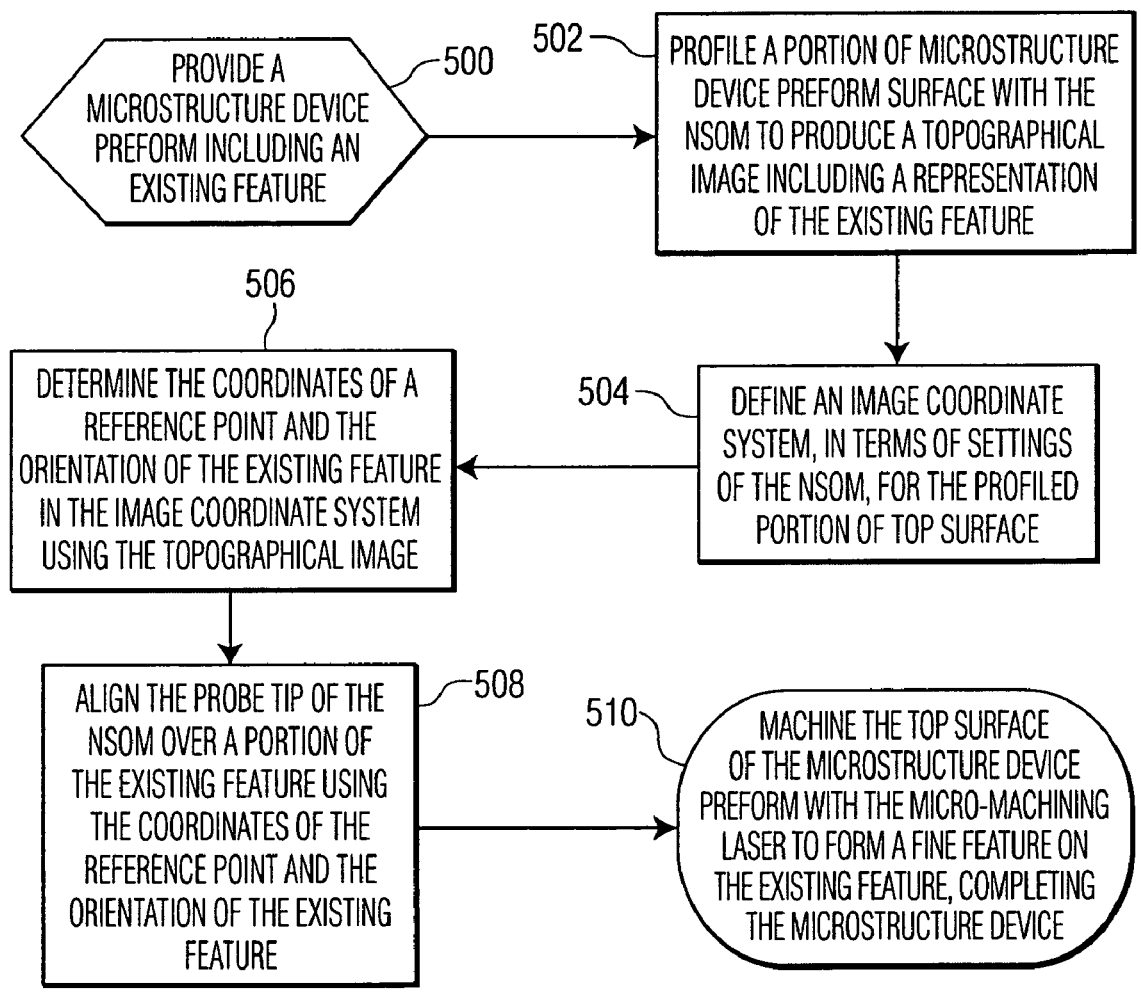
FIG. 5 is a flow chart illustrating an exemplary method of laser machining a fine feature on an existing feature of a microstructure device preform according to the present invention.

FIG. 5 illustrates an exemplary method for manufacturing a microstructure device, which includes at least one fine feature on an existing feature, using an NSOM laser micromachining system according to the present invention. The existing feature to be machined may have submicron dimensions. The microstructure device to be manufactured may be any of a number of microstructure devices including, for example: microstructure molds; quantum cellular automata; coupled quantum dot devices; resonant tunneling devices; multifunction optical arrays; diffractive optical elements; beam shapers; microlens arrays; optical diffusers; beam splitters; laser diode correctors; fine pitch gratings; photonic crystals; micro-electrical-mechanical systems; micro-circuitry; polymerase chain reaction microsystems; biochips for detection of hazardous chemical and biological agents; high-throughput drug screening and selection Microsystems; micro-surface-acoustic-wave devices; and micro-mechanical oscillators.

The NSOM laser micromachining system includes an NSOM and a micro-machining laser, as in exemplary NSOM laser micromachining system of FIG. 1, which may be used to perform this exemplary method. The micromachining laser may desirably be an ultrafast laser, a pulsed solid state laser, a pulsed dye laser, a microchip laser, a pulsed $CO_2$ laser, or an excimer laser.

Microstructure device preform 112, which includes an existing feature on its top surface, is provided, step 500. This preform is mounted in the NSOM. A portion of the top surface of the microstructure device preform is profiled with the NSOM to produce a topographical image of this top surface portion, step 502. The portion of the profiled top surface is selected such that the resulting topographical image includes a representation of the existing feature. One exemplary method to select the top surface portion to be profiled involves optically imaging the top surface of the microstructure device preform to produce an optical image of the preform. This may be performed with a digital camera focused on the top surface. The optical image may desirably include the NSOM probe or other parts of the NSOM to act as reference points. An area of the top surface that includes the existing feature may be identified from the optical image. To identify the general area of surface that includes the existing feature, the optical image does not need submicron resolution, even though the feature to be identified may have submicron dimensions. Other indicia, such as the edges of microstructure device preform 112 may be used to identify the desired area in the optical image.

Probe tip 210 of the NSOM is then aligned over a point in the selected portion of the top surface of microstructure device preform 112, for example the upper left hand corner of the portion. The distance between probe tip 210 of NSOM probe 110 and a surface of microstructure device preform 112 at this starting point is determined. This distance may desirably be determined by detecting the atomic force between probe tip 210 and the surface as described above with reference to the exemplary embodiments of FIGS. 3 and 4.

The distance between probe tip 210 and the surface of the microstructure device preform 112 is then controlled to be substantially equal to a desired profiling distance. The desired profiling distance is based on a number of factors including the size of probe tip 210, and the roughness of the surface to be profiled, but is desirably in the range of up to about 10 nm (contact mode profiling), or the range about 10 nm to 50 nm (non-contact mode profiling). The distance between probe tip 210 of NSOM probe 110 and the surface of the microstructure device preform 112 is desirably controlled using a piezo-electric, or other fine motion, Z motion stage to control a vertical position of either the NSOM probe or the microstructure device preform. The amount of drive voltage applied to the motion stage is based on the distance between probe tip 210 and the surface of microstructure preform 112 at the given point. It is desirable that the distance between probe tip 210 and the surface of microstructure device preform 112 be controlled with a tolerance of less than 5 nm.

The probe tip is scanned over the selected portion of the top surface while repeatedly measuring the distance between probe tip 210 and the top surface and controlling the vertical position of either NSOM probe 110 or microstructure device preform 112 to maintain the separation substantially equal to the profiling distance. The scanning of probe tip 210 over the selected portion of the top surface may be performed in a raster scan pattern, where the probe tip is moved back and forth across the selected portion in a first horizontal direction (the X-direction), performing a plurality of passes. At the end of each profiling pass in the X-direction (i.e. between each consecutive pair of X passes), the probe tip is moved a predetermined distance in a second perpendicular horizontal direction (the Y-direction), thus scanning the selected portion of the top surface. The predetermined distance of the Y step is related to resolution of the topographical image and may desirably be equal to approximately the width of probe tip 210.

Figure 6:
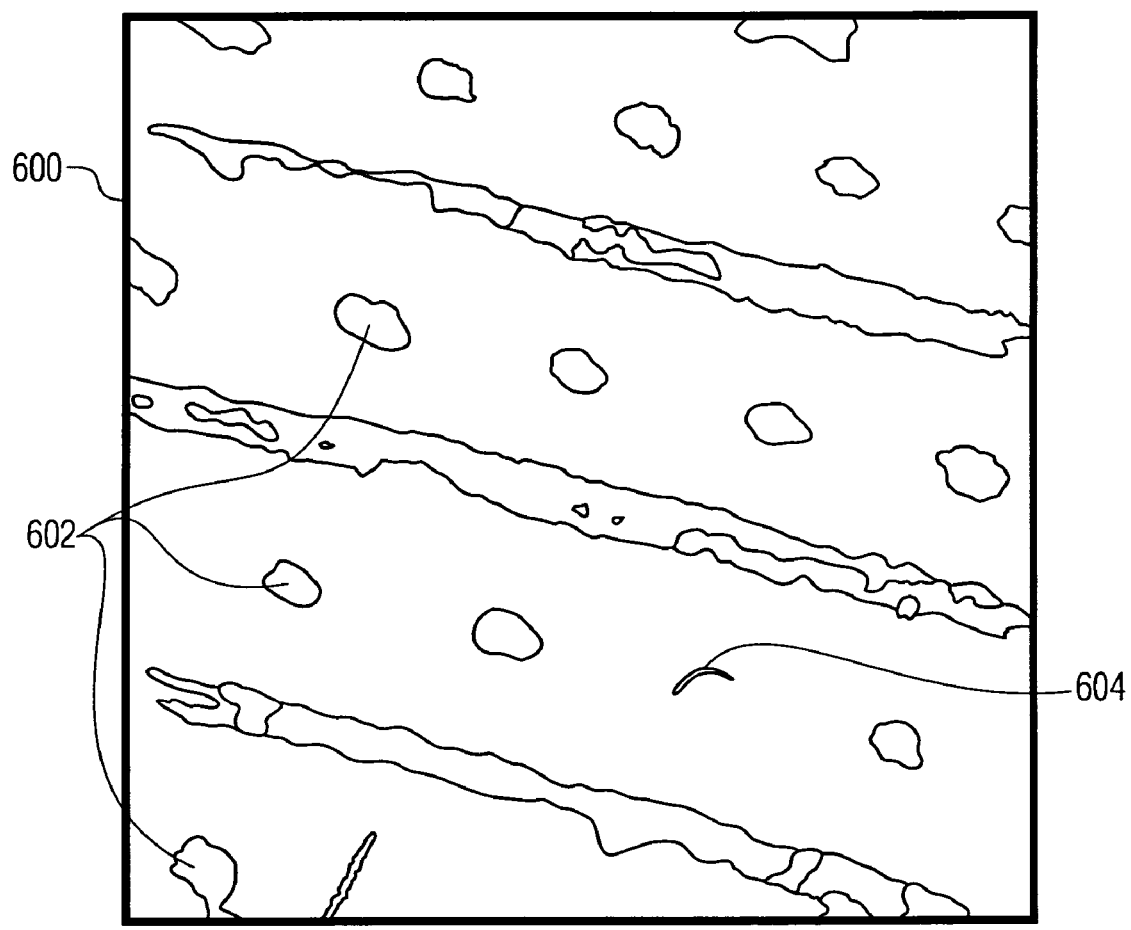
FIG. 6 is an exemplary topographical image of a surface produced during any one of the exemplary methods of FIG. 5, 7, or 8.

FIG. 6 illustrates exemplary topographical image 600 of a portion of a top surface of a microstructure. The height of the surface is represented in grayscale. Exemplary topographical image 600 includes a number of features 602 and defect 604 where one of the features is missing from the otherwise regular pattern. Defect 604 may be intentional. For example, if this is an image of a photonic crystal, defect 604 may be introduced to tune the transmission spectrum of the photonic crystal. Alternatively, defect 604 may be unintentional and may affect the performance of the microstructure device.

Once the topographical image is produced, an image coordinate system is defined, step 504, for the profiled portion of top surface of the microstructure device preform based on the topographical image. It is noted that, the topographical information of the top surface used to produce the topographical image is based on the vertical movement needed to maintain the distance between probe tip 210 and microstructure device preform 112 which is correlated to the X and Y direction positions during the profiling scan. Therefore, the image coordinate system of the topographical image includes X, Y, and Z coordinates that are scaled, at least initially, in terms of settings of the NSOM motion stages. This scaling may be desirable to allow simplified control of the position of probe tip 210 above the top surface of microstructure device reform 112.

Coordinates of a reference point and the orientation of the existing feature of the top surface of microstructure device preform 112 in the image coordinate system are determined using the topographical image. Unless otherwise calibrated, these coordinates are in terms of settings of the motion stages of the NSOM. If microstructure device preform 112 has two, or more, calibration marks which are a known distance apart and which are represented in the topographical image, a conversion factor may be determined between the image coordinate system and a spatial coordinate system of the microstructure device preform to allow scaling of the topographical image to actual distances, as opposed to NSOM settings. Exemplary coordinates of the calibration points of the top surface are determined in the image coordinate system using the topographical image. The conversion factor between the image coordinate system and the spatial coordinate system of microstructure device preform 112 may then be easily calculated. This may be particularly desirable when the desired dimensions of the fine feature are known in actual spatial measurements and not in terms of NSOM settings. It is possible that the motion stages may already be calibrated and in which case calculation of this conversion factor is unnecessary.

Probe tip 210 of an NSOM probe 110 is aligned over a portion of the existing feature of microstructure device preform, step 508, using the coordinates of the reference point and the orientation of the existing feature determined in step 506. Knowing both the orientation of the existing feature in the image coordinate system and the coordinates of a reference point allows the desired portion of the existing feature to be selected where machining of the fine feature is to begin. Desirably, the probe tip is aligned horizontally over the desired portion of the existing feature using the X and Y coordinates of the desired portion and the distance between probe tip 210 and the top surface of microstructure device preform 112 may be controlled to be substantially a desired machining distance.

The desired machining distance is based on a number of factors including the peak power of the pulses of laser light, their peak wavelength, the size of probe tip 210, and the type of machining to be accomplished, but is desirably in the range of up to about half of the wavelength of the pulses of light used for machining the surface. The distance between probe tip 210 of NSOM probe 110 and the surface of the microstructure device preform 112 is desirably controlled using a piezo-electric, or other fine motion, Z motion stage to control a vertical position of either the NSOM probe or the microstructure workpiece. The amount of drive voltage applied to the motion stage is based on the Z coordinate information of the topographical image of the top surface of microstructure device preform 112 produced in step 502. It is desirable that the distance between probe tip 210 and the surface of microstructure preform 112 be controlled with a tolerance of less than 5 nm. As previously noted, a conversion factor between the image coordinate system and the spatial coordinate system of microstructure device preform 112 may be used to assist in determining the desired alignment coordinates.

The top surface of microstructure device preform 112 is then machined with the micro-machining laser to form the one, or more, desired fine features on the existing feature, step 510, completing the microstructure device. Once the NSOM has aligned probe tip 210 in the desired position, laser source 100 is used to generate pulses of laser light. A harmonic generating crystal may be used to produce pulses of laser light having a shorter peak wavelength from the initial pulses of laser light generated by laser source 100. Additionally, an attenuator may be included in laser source 100 to control the fluence of the pulses of laser light, producing pulses of laser light having a predetermined near-field machining fluence. A polarization controller adjusts the polarization of the pulses to be substantially circular. The resulting pulses of laser light are coupled into NSOM probe 110.

As shown in FIG. 2, once the distance between probe tip 210 and the surface of microstructure preform 112 has been set to the desired machining distance in step 508 and the pulses of laser light are coupled into NSOM probe 110 in step 510, a near-field mode portion 206 of these pulses of laser light is transmitted through probe tip 210 of the NSOM probe and is evanescently coupled onto near-field irradiated area 208 of the surface of microstructure device preform 112. This causes near-field irradiated area 208 to be laser machined by near-field mode portion 206. Near-field irradiated area 208 desirably mimics the shape and size of probe tip 210 and corresponds to the horizontal location of probe tip 210. As described above with regard to FIG. 2, probe tip 210 desirably has an elliptical cross-sectional shape and a tip area less than a square of the peak wavelength of the pulses of laser light. Laser machining of near-field irradiated area 208 in step 510 includes: ablating workpiece material of the microstructure device preform in the near-field irradiated area; laser-assisted chemical vapor depositing deposition material on the surface of the microstructure device preform in the near-field irradiated area; exposing photoresist on the surface of the microstructure device preform in the near-field irradiated area; changing an index of refraction of workpiece material of the microstructure device preform in the near-field irradiated area; altering a lattice structure of workpiece material of the microstructure device preform in the near-field irradiated area; and changing a chemical composition of workpiece material of the microstructure device preform in the near-field irradiated area.

If the all of the fine feature has been machined, then the laser machining of the fine feature is complete, and the completed microstructure device may be removed from the NSOM. If not, then the exemplary method loops back to step 508 and probe tip 210 is moved and aligned to an unmachined portion of the surface of microstructure device preform 112 which corresponds to a portion of the fine feature remaining to be machined. This may be done by moving either NSOM probe 110 or microstructure device preform 112. This is continued until the fine feature is completely machined. Thus, the movement scans the probe tip over the entire region of the top surface of the microstructure device preform corresponding to the fine feature. The machining distance is desirably maintained between probe tip 210 and the top surface throughout the laser machining of the fine feature.

If laser source 100 includes a laser oscillator to generate the pulses of laser light and a shutter to control emission of the pulses, then probe tip 210 may be scanned over a larger portion of the surface of microstructure preform 112 that includes the existing feature. The shutter may be opened when probe tip 10 is being scanned over the region where the fine feature is to be formed, thereby allowing laser machining of the fine feature, and closed when the probe tip is being scanned over other regions of the top surface, thereby preventing unwanted laser machining of these other scanned regions of the top surface of microstructure device preform 112.

It is noted that, if the microstructure device to be manufactured is a micro-mechanical oscillator, the resonance spectrum of the micro-mechanical oscillator may be tuned by the machining of the fine feature on the existing feature. In this case, the micro-mechanical oscillator may desirably be activated before machining and an initial resonance spectrum of the micro-mechanical oscillator determined. This initial resonance spectrum may then be compared to a desired resonance spectrum to determine a desired shape on the existing feature for a fine feature to tune the resonance spectrum of the micro-mechanical oscillator. Similarly, if the microstructure device to be manufactured is a photonic crystal, its transmission spectrum may tuned by machining a fine feature, or defect 604, is the regular pattern of the photonic crystal, as shown in FIG. 6. The transmission spectrum of the photonic crystal is determined and compared to a desired transmission spectrum. A desired shape and location of the defect are then determined.

Figure 7:
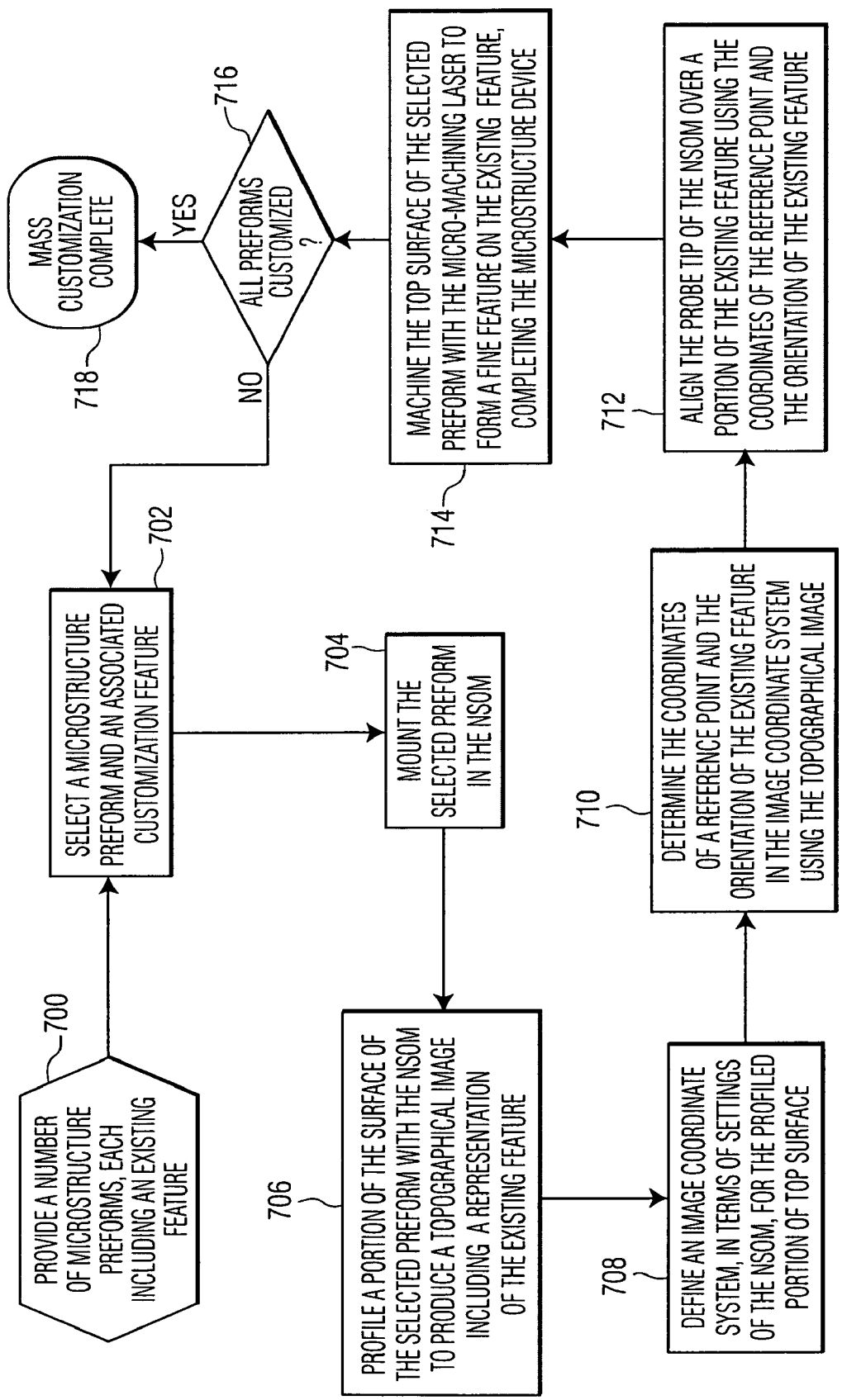
FIG. 7 is a flow chart illustrating an exemplary method of mass customizing a plurality of microstructure preforms according to the present invention.

FIG. 7 illustrates an exemplary method for mass customizing a plurality of microstructures with an NSOM laser micromachining system so that each microstructure has at least one of a predetermined set of customization features. The NSOM laser micromachining system, which includes an NSOM and a micro-machining laser, may be similar to the exemplary system of FIG. 1. Many steps of this exemplary method are similar to those of the exemplary method of FIG. 5 and may be performed the same way as described above with reference to FIG. 5.

A number of microstructure preforms are provided, step 700. Each microstructure preform includes an existing feature on its top surface. The microstructures to be customized may include a number of different microstructures, such as: microstructure molds; quantum cellular automata; coupled quantum dot devices; resonant tunneling devices; multifunction optical arrays; diffractive optical elements; beam shapers; microlens arrays; optical diffusers; beam splitters; laser diode correctors; fine pitch gratings; photonic crystals; micro-electrical-mechanical systems; micro-circuitry; polymerase chain reaction microsystems; biochips for detection of hazardous chemical and biological agents; high-throughput drug screening and selection Microsystems; micro-surface-acoustic-wave devices; and micro-mechanical oscillators.

One of the microstructure preforms is selected for customization, step 702, along with at least one customization feature from the predetermined set of customization features, which is to be machined on the existing feature of the top surface. The selected microstructure preform is mounted in the NSOM, step 704. As in the exemplary method of FIG. 5, a portion of the top surface of the selected microstructure preform is profiled with the NSOM to produce a topographical image of the selected portion, step 706. This portion of the top surface is selected such that the resulting topographical image includes a representation of the existing feature.

An image coordinate system, in terms of settings of the NSOM, is defined for the profiled portion of top surface of the selected microstructure preform based on the topographical image, step 708. The coordinates of a reference point and the orientation of the existing feature of the selected microstructure preform to be machined are determined in the image coordinate system using the topographical image, step 710.

The probe tip of the NSOM is then aligned over a portion of the existing feature of the selected microstructure preform, step 712 using the coordinates of the reference point and the orientation of the existing feature determined in step 710. The top surface of the selected microstructure preform is then machined with the micro-machining laser, step 714, to form the customization feature(s) selected in step 702. This leads to a completed microstructure as in the exemplary method of FIG. 5 (and in the present exemplary case, the microstructure is customized).

It is determined whether all of the provided number of microstructure preforms have been customized, step 716. If they have all been customized then mass customization is complete, step 718. If not, then a new microstructure preform and associated customization feature(s) are selected, step 702, and steps 704, 706, 708, 710, 712, 714, and 716 are repeated for the newly selected microstructure preform until every microstructure preform provided in step 700 is customized.

Figure 8:
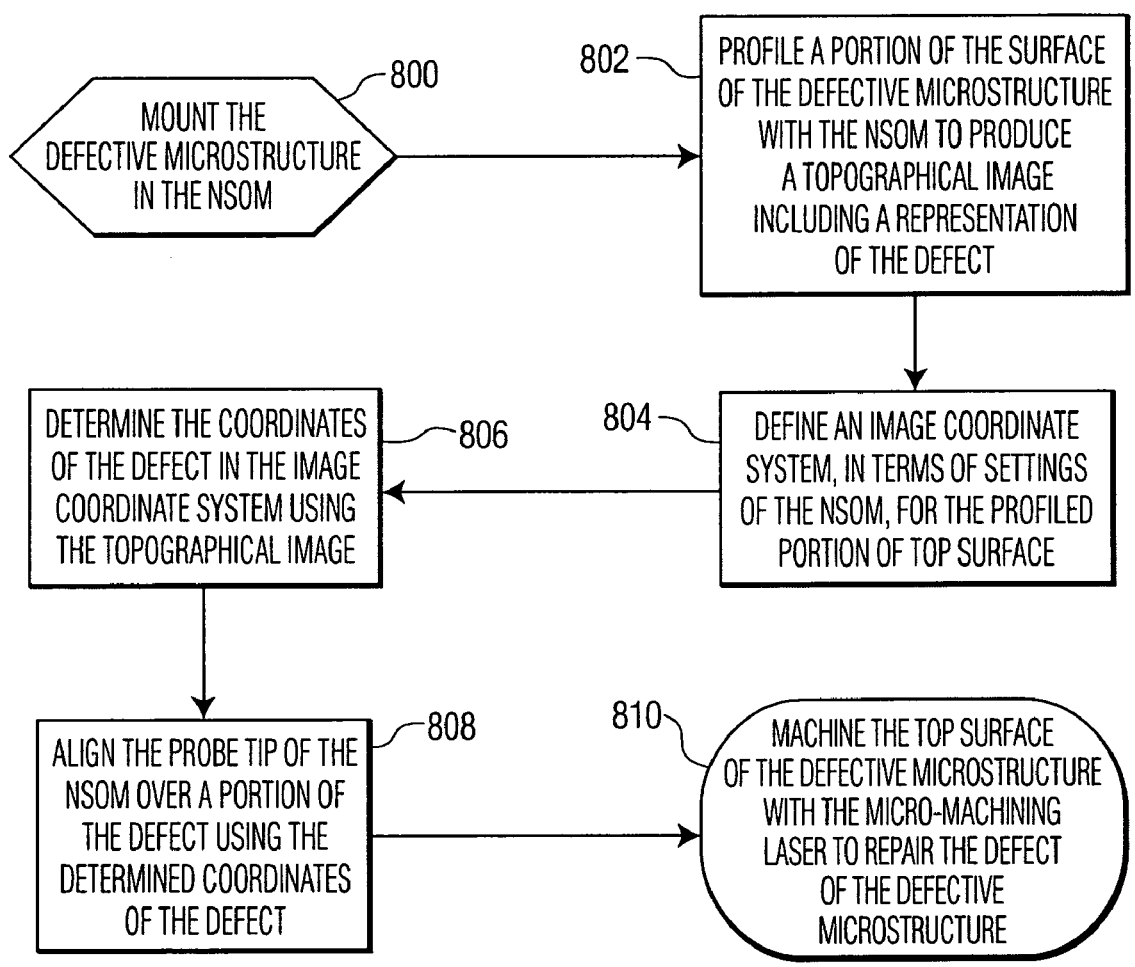
FIG. 8 is a flow chart illustrating an exemplary method of repairing a defect on a defective microstructure according to the present invention.

FIG. 8 illustrates an exemplary method for repairing a microstructure with an NSOM laser micromachining system including an NSOM and a micro-machining laser, such as, for example the exemplary system of FIG. 1. The microstructure to be repaired, which includes a defect on a top surface, may include any one of a number of microstructures including: microstructure molds; quantum cellular automata; coupled quantum dot devices; resonant tunneling devices; multifunction optical arrays; diffractive optical elements; beam shapers; microlens arrays; optical diffusers; beam splitters; laser diode correctors; fine pitch gratings; photonic crystals; micro-electrical-mechanical systems; micro-circuitry; polymerase chain reaction microsystems; biochips for detection of hazardous chemical and biological agents; high-throughput drug screening and selection microsystems; micro-surface-acoustic-wave devices; and micro-mechanical oscillators. One common defect that may be repaired using the exemplary method of FIG. 8 is a short circuit in a microstructure device that includes micro-circuitry.

As with the exemplary method of FIG. 7, the exemplary method of FIG. 8 includes many steps that have been described in detail above with reference to the exemplary method of FIG. 5.

The defective microstructure is mounted in the NSOM, step 800. A portion of the top surface of the defective microstructure is profiled with the NSOM to produce a topographical image of this portion of the top surface, step 802. The portion of the top surface may be desirably selected such that the topographical image includes a representation of the defect. It is noted that the location of the defect is not known beforehand, but that many defects in microstructures may be identified from NSOM topographical images. FIG. 6 illustrates this ability of topographical images. Exemplary topographical image 600 includes defect 604, which may be easily identified. In the case that the location of the defect is not known beforehand, the selected portion of the top surface may desirably include most, or all of, the top surface to allow for identification of the defect during the step of the exemplary procedure.

An image coordinate system, in terms of settings of the NSOM, is defined for the profiled portion of top surface of the defective microstructure based on the topographical image, step 804, and coordinates of the defect of the top surface of the defective microstructure are determined in the image coordinate system, step 806, using the topographical image. The probe tip of the NSOM is aligned over a portion of the defect of the defective microstructure, step 808, using the coordinates of the defect determined in step 806, and the top surface of the defective microstructure is machined with the micro-machining laser, step 810, to repair the defect of the defective microstructure.

FIG. 9 is a flow chart illustrating an exemplary method for laser machining a predetermined feature on a surface of a microstructure device, using an NSOM laser micromachining system which includes an NSOM and a micro-machining laser, such as, for example the exemplary system of FIG. 1. Using this exemplary method, NSOM laser micromachining systems may achieve the advantage of allowing the user to precisely monitor the progress of the laser machining process, in ambient atmosphere, without removing the microstructure device preform from the micromachining system, by profiling the preform surface during machining. As with the exemplary method of FIGS. 7 and 8, the exemplary method of FIG. 9 includes many steps that have been described in detail above with reference to the exemplary method of FIG. 5.

The surface of the microstructure device preform is laser machined to form a preliminary feature, step 900. Although this step may be performed using any laser micro-machining system, it may be desirable for this step to be performed using the NSOM laser micro-machining system used in the remaining step of this exemplary method. A portion of the surface of the microstructure device preform is profiled with the NSOM to produce a topographical image of that portion of the surface, step 902. The portion of the surface is selected such that the topographical image includes a representation of the preliminary feature.

The representation of the preliminary feature in the topographical image is compared to a predetermined feature representation, step 904. This step may desirably include defining an image coordinate system, in terms of settings of the NSOM, as in the exemplary methods of FIGS. 5, 7, and 8, for the profiled portion of surface of the microstructure device preform based on the topographical image. Coordinates of a reference point and the orientation of the preliminary feature may then be determined in the image coordinate system using the topographical image. Using the coordinates of the reference point and the orientation of the preliminary feature, the predetermined feature representation may be transformed into the image coordinate system to simplify comparison of the representations. The representation of the preliminary feature may then be compared to the transformed predetermined feature representation in the image coordinate system. Alternatively, the topographical image may be transformed into a coordinate system of the predetermined feature representation, but this may lead to additional transformations of the resulting machining modifications before their use by the NSOM laser micromachining system.

Machining modifications of the preliminary feature needed to form the predetermined feature from the preliminary feature are determined, step 906, based on the comparison of step 904. It is also determined whether the representations of the preliminary feature and the predetermined feature match, step 908. If so, the laser machining of the predetermined feature is complete, step 910. Otherwise, the surface of the microstructure device preform is laser machined again to modify the preliminary feature, step 912, based on the machining modifications determined in step 906, and steps 902, 904, 906, 908, and 912 are repeated until the representation of the preliminary feature substantially matches the predetermined feature representation.

It is noted that the exemplary method of FIG. 9 is particularly suited to laser machining of features either by ablating device material of the microstructure device preform or by LCVD of deposition material on the surface of the microstructure device preform. In either of these exemplary cases, step 906 may desirably include identifying regions of the preliminary feature in which the surface height in its representation is different the corresponding surface height in the predetermined feature representation. The difference between the surfaces in each of these regions may then be determined. For ablated features, the differences between the surface height in the representation of the preliminary feature and the corresponding surface height in the predetermined feature representation in the identified regions are determined. For deposited features, the differences between the corresponding surface height in the predetermined feature representation and the surface height in the representation of the preliminary feature in the identified regions are determined. The machining modifications are then amounts of material equal to these differences to be either ablated from or deposited on the surface of the microstructure device preform, as appropriate.

The present invention includes exemplary methods to laser machine surfaces of a microstructure preform using near field radiation to manufacture, customize and repair microstructures. The use of these exemplary methods allows greatly simplified, yet highly accurate, micro-machining in ambient atmosphere conditions. Such techniques may help to bring microstructures and nanotechnology into more common use. Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method for manufacturing a microstructure device, which includes at least one fine feature on an existing feature, using a near field scanning optical microscope (NSOM) laser micromachining system including an NSOM and a micromachining laser, the method comprising the steps of:
    a) providing a microstructure device preform including the existing feature on a top surface;
    b) profiling a portion of the top surface of the microstructure device preform with the NSOM to produce a topographical image of the portion of the top surface, the portion of the top surface selected such that the topographical image includes a representation of the existing feature;
    c) defining an image coordinate system, in terms of settings of the NSOM, for the profiled portion of top surface of the microstructure device preform based on the topographical image;
    d) determining coordinates of a reference point and an orientation of the existing feature of the top surface of the microstructure device preform in the image coordinate system using the topographical image;
    e) aligning a probe tip of an NSOM probe of the NSOM over a portion of the existing feature of the microstructure device preform using the coordinates of the reference point and the orientation of the existing feature determined in step (d); and
    f) machining the top surface of the microstructure device preform using light from the micro-machining laser coupled through the NSOM probe to form the at least one fine feature on the existing feature, completing the microstructure device.

2. The method according to claim 1, wherein step (b) includes the steps of:
   b1) selecting the portion of the top surface of the microstructure device preform to be profiled;
   b2) aligning the probe tip of the NSOM over a point in the selected portion of the top surface of the microstructure device preform;
   b3) determining a distance between the probe tip of the NSOM and the top surface of the microstructure device preform;
   b4) controlling the distance between the probe tip and the top surface such that the distance is substantially equal to a profiling distance by moving one of the NSOM probe or the microstructure device preform in a vertical direction;
   b5) scanning the probe tip over the selected portion of the top surface while repeating steps (b3) and (b4) to maintain the distance between the probe tip and the top surface substantially equal to the profiling distance;
   b6) determining topographical information of the surface based on the vertical movement of the one of the NSOM probe or the microstructure device preform moved in step (b4).

3. The method according to claim 2, wherein step (b1) includes the steps of:
   b1a) optically imaging the top surface of the microstructure device preform to produce an optical image;
   b1b) identifying an area of the top surface that includes the existing feature from the optical image;
   b1c) selecting the area identified in step (b1b) as the portion of the top surface to be profiled.

4. A method for manufacturing a microstructure device, which includes at least one fine feature on an existing feature, using a near field scanning optical microscope (NSOM) laser micromachining system including an NSOM and a micro-machining laser, the method comprising the steps of:
   a) providing a microstructure device preform including the existing feature on a top surface;
   b) profiling a portion of the top surface of the microstructure device preform with the NSOM to produce a topographical image of the portion of the top surface, the portion of the top surface selected such that the topographical image includes a representation of the existing feature;
   b) selecting a portion of the top surface of the microstructure device preform to be profiled;
   c) aligning a probe tip of the NSOM over a point in the selected portion of the top surface of the microstructure device preform;
   d) determining a distance between the probe tip of the NSOM and the top surface of the microstructure device preform by detecting an atomic force between the probe tip and the top surface;
   e) controlling the distance between the probe tip and the top surface such that the distance is substantially equal to a profiling distance by moving one of the NSOM probe or the microstructure device preform in a vertical direction;
   f) scanning the probe tip over the selected portion of the top surface while repeating steps (d) and (e) to maintain the distance between the probe tip and the top surface substantially equal to the profiling distance;
   g) determining topographical information of the surface based on the vertical movement of the one of the NSOM probe or the microstructure device preform moved in step (e);
   h) defining an image coordinate system, in terms of settings of the NSOM, for the profiled portion of top surface of the microstructure device preform based on the topographical image;
   i) determining coordinates of a reference point and an orientation of the existing feature of the top surface of the microstructure device preform in the image coordinate system using the topographical image;
   j) aligning a probe tip of an NSOM probe of the NSOM over a portion of the existing feature of the microstructure device preform using the coordinates of the reference point and the orientation of the existing feature determined in step (i); and
   k) machining the top surface of the microstructure device preform with the micro-machining laser to form the at least one fine feature on the existing feature, completing the microstructure device.

5. A method for manufacturing a microstructure device, which includes at least one fine feature on an existing feature, using a near field scanning optical microscope (NSOM) laser micromachining system including an NSOM and a micro-machining laser, the method comprising the steps of:
   a) providing a microstructure device preform including the existing feature on a top surface;
   b) profiling a portion of the top surface of the microstructure device preform with the NSOM to produce a topographical image of the portion of the top surface, the portion of the top surface selected such that the topographical image includes a representation of the existing feature;
   b) selecting a portion of the top surface of the microstructure device preform to be profiled;
   c) aligning a probe tip of the NSOM over a point in the selected portion of the top surface of the microstructure device preform;
   d) generating a periodic oscillation of the NSOM probe of the NSOM in the vertical direction;
   e) detecting at least one of;
      a period of the periodic oscillation of the NSOM probe; or
      an amplitude of the periodic oscillation of the NSOM probe; and
   f) determining the distance between the probe tip and the top surface based on changes in the at least one of the period or the amplitude of the periodic oscillation detected in step (e);
   g) controlling the distance between the probe tip and the top surface such that the distance is substantially equal to a profiling distance by moving one of the NSOM probe or the microstructure device preform in a vertical direction;
   h) scanning the probe tip over the selected portion of the top surface while repeating steps (d), (e), (f) and (g) to maintain the distance between the probe tip and the top surface substantially equal to the profiling distance;
   i) determining topographical information of the surface based on the vertical movement of the one of the NSOM probe or the microstructure device preform moved in step (g);

j) defining an image coordinate system, in terms of settings of the NSOM, for the profiled portion of top surface of the microstructure device preform based on the topographical image;

k) determining coordinates of a reference point and an orientation of the existing feature of the top surface of the microstructure device preform in the image coordinate system using the topographical image;

l) aligning a probe tip of an NSOM probe of the NSOM over a portion of the existing feature of the microstructure device preform using the coordinates of the reference point and the orientation of the existing feature determined in step (k); and m) machining the top surface at the microstructure device preform with the micro-machining laser to form the at least one fine feature on the existing feature, completing the microstructure device.

6. The method according to claim 2, wherein the step of controlling the distance between the probe tip and the top surface of the microstructure device preform includes using a Z motion stage to control a vertical position of one of the NSOM probe or the microstructure device preform based on the distance between the probe tip and the top surface determined in step (b3).

7. The method according to claim 2, wherein:
the profiling distance is in the range of up to about 50 nm; and
the distance between the probe tip of the NSOM and the top surface of the microstructure device preform is controlled in step (b4) with a tolerance of less than 5 nm.

8. The method according to claim 2, wherein step (b5) includes:
b5a) moving the probe tip back and forth across the selected portion in a first horizontal direction to perform a plurality of passes; and
b5b) moving the probe tip a predetermined distance in a second horizontal direction between each consecutive pair of passes, the second horizontal direction being different from the first horizontal direction, thereby scanning the selected portion of the top surface.

9. The method according to claim 1, wherein the image coordinate system Includes X, Y, and Z coordinates for the profiled portion of the top surface of the microstructure device preform, the X, Y, and Z coordinates being respectively scaled to corresponding X, Y, and Z settings of the NSOM determined in step (b).

10. A method for manufacturing a microstructure device, which includes at least one fine feature on an existing feature, using a near field scanning optical microscope (NSOM) laser micromachining system including an NSOM and a micro-machining laser, the method comprising the steps of:

a) providing a microstructure device preform including the existing feature on a top surface;

b) profiling a portion of the top surface of the microstructure device preform with the NSOM to produce a topographical image of the portion of the top surface, the portion of the top surface selected such that the topographical image includes a representation of the existing feature;

c) defining an image coordinate system, in terms of settings of the NSOM, for the profiled portion of top surface of the microstructure device preform based on the topographical image;

d) determining coordinates of a reference point and an orientation of the existing feature of the top surface of the microstructure device preform in the image coordinate system using the topographical image;

e) determining coordinates of two calibration points of the top surface of the microstructure device preform in the image coordinate system using the topographical image, the two calibration points being a predetermined distance apart;

f) calculating a conversion factor between the image coordinate system and a spatial coordinate system of the microstructure device preform;

g) aligning a probe tip of an NSOM probe of the NSOM over the portion of the existing feature using the coordinates of the reference point and the orientation of the existing feature determined in step (d) and the conversion factor between the image coordinate system and the spatial coordinate system determined in step (f); and h) machining the top surface of the microstructure device preform with the micro-machining laser to form the at least one fine feature on the existing feature, completing the microstructure device.

11. The method according to claim 1, wherein step (e) includes the steps of:
e1) aligning the probe tip horizontally over a portion of the existing feature of the microstructure device preform; and
e2) controlling the distance between the probe tip and the top surface of the microstructure device preform to be substantially a machining distance based on the topographical image of the portion of the top surface of the microstructure device preform and the image coordinate system.

12. The method according to claim 11, wherein the step of controlling the distance between the probe tip and the top surface of the microstructure device preform to be substantially the machining distance includes using a Z motion stage to control a vertical position of one of the NSOM probe or the microstructure device preform.

13. The method according to claim 11, wherein:
the machining distance is in a range of up to half of a peak wavelength of light generated by the micro-machining laser; and
the distance between the probe tip of the NSOM probe and the top surface of the microstructure device preform is controlled in step (e2) with a tolerance of less than 5 nm.

14. The method according to claim 1, wherein step (f) includes the steps of:
f1) using the micro-machining laser to generate pulses of laser light;
f2) coupling the pulses of laser light into the NSOM probe;
f3) coupling a near-field mode portion of the pulses of laser light through the probe tip of the NSOM probe and onto the portion of the existing feature of the microstructure device preform over which the probe tip is aligned to machine the top surface of the microstructure device preform in the portion of the existing feature over which the probe tip is aligned; and
f4) aligning the probe tip over another portion of the existing feature and repeating steps f1, f2, f3, and f4 until the microstructure device is completed.

15. The method according to claim 14, wherein:
the micro-machining laser includes a laser oscillator and an attenuator; and step (f1) includes the steps of:
  f1a) using the laser oscillator to generate initial pulses of laser light having an initial fluence; and
  f1b) using the attenuator to control the fluence of the initial pulses of laser light, thereby producing the pulses of laser light having a predetermined near-field machining fluence.

16. The method according to claim 14, wherein:
the micro-machining laser includes a laser oscillator and a polarization controller; and
step (f1) includes the steps of:
  f1a) using the laser oscillator to generate initial pulses of laser light having an initial polarization; and
  f1b) using the polarization controller to adjust the initial polarization of the initial pulses of laser light to a substantially circular polarization.

17. The method according to claim 14, wherein:
the micro-machining laser includes a laser oscillator to generate the pulses of laser light in step (f1) and a shutter to control emission of the pulses; and
step (f4) includes the steps of:
  f4a) moving the at least one of the NSOM probe or the microstructure device preform to scan the probe tip over a region of the top surface of the microstructure device preform including portions of the existing feature in which the at least one fine feature is to be machined;
  f4b) opening the shutter when the probe tip is scanned over the portions of the existing feature in which the at least one fine feature is to be machined, thereby allowing machining of the at least one fine feature; and
  f4c) closing the shutter when the probe tip is scanned over other areas of the scanned region of the top surface of the microstructure device preform, thereby preventing machining of the other areas of the scanned region.

18. The method according to claim 1, wherein machining the top surface of the microstructure device preform in step (f) includes at least one of:
  ablating device material of the microstructure device preform in the portion of the existing feature over which the probe tip is aligned;
  laser-assisted chemical vapor depositing deposition material on the top surface or the microstructure device preform in the portion of the existing feature over which the probe tip is aligned;
  exposing photoresist on the top surface of the microstructure device preform in the portion of the existing feature over which the probe tip is aligned;
  changing an index of refraction of the device material of the microstructure device preform in the portion of the existing feature over which the probe tip is aligned;
  altering a lattice structure of the device material of the microstructure device preform in the portion of the existing feature over which the probe tip is aligned; or
  changing a chemical composition of the device material of the microstructure device preform in the portion of the existing feature over which the probe tip is aligned.

19. The method according to claim 1, wherein the micro-machining laser is one of an ultrafast laser, a pulsed solid state laser, a pulsed dye laser, a microchip laser, a pulsed $CO_2$ laser, or an excimer laser.

20. The method according to claim 1, wherein the microstructure device to be manufactured is at least one of a microstructure mold, a quantum cellular automation, a coupled quantum dot device, a resonant tunneling device, a multifunction optical array, a diffractive optical element, a beam shaper, a microlens array, an optical diffuser, a beam splitter, a laser diode corrector, a fine pitch grating, a photonic crystal, a micro-electrical-mechanical system, micro-circuitry, a polymerase chain reaction microsystem, a biochip for detection of hazardous chemical and biological agents, a high-throughput drug screening and selection microsystem, a micro-surface-acoustic-wave device, or a micro-mechanical oscillator.

21. The method according to claim 1, wherein:
the microstructure device to be manufactured is a micro-mechanical oscillator; and
a resonance spectrum of the micro-mechanical oscillator is tuned by the at least one fine feature machined on the existing feature.

22. The method according to claim 21, wherein:
step (a) includes the steps of;
  a1) activating the micro-mechanical oscillator;
  a2) determining an initial resonance spectrum of the micro-mechanical oscillator;
  a3) comparing the initial resonance spectrum determined in step (a2) to a predetermined resonance spectrum; and
  a4) determining a desired shape on the existing feature of the at least one fine feature based on the comparison in step (a3); and
step (f) includes machining the at least one fine feature to have the desired shape on the existing feature determined in step (a4) with the micro-machining laser.

23. The method according to claim 1, wherein:
the microstructure device to be manufactured is a photonic crystal;
the at least one fine feature to be machined is a defect; and
a transmission spectrum of the photonic crystal is tuned by the defect.

24. The method according to claim 23, wherein:
step (a) includes the steps of;
  a1) determining the transmission spectrum of the photonic crystal;
  a2) comparing the transmission spectrum determined in step (a1) to a predetermined transmission spectrum; and
  a3) determining a shape of the defect and a defect location based on the comparison in step (a2); and
step (f) includes machining the defect at the defect location and having the shape determined in step (a3).

25. The method according to claim 1, wherein the microstructure device to be manufactured is a micro-electrical-mechanical system.

* * * * *